(12) United States Patent
Matsuzaki et al.

(10) Patent No.: US 7,165,899 B2
(45) Date of Patent: Jan. 23, 2007

(54) PACKAGE FOR HOUSING OPTICAL SEMICONDUCTOR ELEMENT AND OPTICAL SEMICONDUCTOR APPARATUS

(75) Inventors: Akiko Matsuzaki, Shiga (JP); Hiroshi Shibayama, Shiga (JP)

(73) Assignee: Kyocera Corporation, Kyoto (JP)

( * ) Notice: Subject to any disclaimer, the term of this patent is extended or adjusted under 35 U.S.C. 154(b) by 256 days.

(21) Appl. No.: 10/977,557

(22) Filed: Oct. 29, 2004

(65) Prior Publication Data

US 2005/0141826 A1  Jun. 30, 2005

(30) Foreign Application Priority Data

Oct. 30, 2003  (JP) ............... P2003-369959
May 26, 2004  (JP) ............... P2004-156202

(51) Int. Cl.
    *G02B 6/36* (2006.01)
(52) U.S. Cl. ............... 385/92; 385/88; 385/94; 385/14
(58) Field of Classification Search ............... 385/14, 385/88, 89, 92, 93, 94
    See application file for complete search history.

(56) References Cited

U.S. PATENT DOCUMENTS

| | | | |
|---|---|---|---|
| 4,989,934 A * | 2/1991 | Zavracky et al. ............... 385/14 |
| 5,280,191 A * | 1/1994 | Chang ............... 257/712 |
| 5,574,814 A * | 11/1996 | Noddings et al. ............... 385/90 |
| 6,592,269 B1 * | 7/2003 | Brophy et al. ............... 385/92 |
| 2003/0072537 A1 * | 4/2003 | Eichenberger et al. ............... 385/89 |
| 2005/0141826 A1 * | 6/2005 | Matsuzaki et al. ............... 385/92 |
| 2005/0286906 A1 * | 12/2005 | Togami et al. ............... 398/164 |

FOREIGN PATENT DOCUMENTS

JP  2003-198028  7/2003  ............... 385/92 X

* cited by examiner

*Primary Examiner*—Brian M. Healy
(74) *Attorney, Agent, or Firm*—Hogan & Hartson LLP

(57) ABSTRACT

Provided is a package for housing an optical semiconductor element including: a metal-made base body; a metal-made lid body; a light-transmitting member; and an input/output terminal joined to the upper principal surface of the base body so as to cover a through bore. The input/output terminal includes: a dielectric-made first plate portion; a line conductor extending from one base body-side edge to another edge opposite thereto; a dielectric-made second plate portion stacked with its one base body-side end face made flush with the first plate portion; a metal plate made higher than the first plate portion and stacked with its one base body-side end face made flush with the first plate portion; and a lead terminal attached to the lower surface of the input/output terminal lying inside the through bore and electrically connected to the line conductor.

8 Claims, 5 Drawing Sheets

PACKAGE FOR HOUSING OPTICAL SEMICONDUCTOR ELEMENT AND OPTICAL SEMICONDUCTOR APPARATUS

BACKGROUND OF THE INVENTION

1. Field of the Invention

The present invention relates to a package for housing an optical semiconductor element for use in the optical communication fields and so forth, and to an optical semiconductor apparatus.

2. Description of the Related Art

Shown in FIG. 5 is an example of a conventional optical semiconductor apparatus that air-tightly accommodates therein an optical semiconductor element operating at high frequencies, such as an optical semiconductor laser (LD) or a photodiode (PD), in the optical communication fields and so forth. FIG. 5 is a sectional view of an optical semiconductor apparatus that accommodates therein an LD as an optical semiconductor element. In FIG. 5, reference numeral 21 represents a base body; 22 represents an optical semiconductor element; 23 represents a metal-made lid body; 24 represents a light-transmitting member; and 26 represents an optical fiber.

The optical semiconductor apparatus shown in FIG. 5 includes a platy base body 21 made of a metal; a lid body 23 made of a metal; a light-transmitting member 24. The lid body 23 is formed in a cylindrical shape, which includes an upper end face 23a having a through hole 23b formed at the center thereof, and a lower end 23c which is left opened and joined to the outer periphery of the upper principal surface of the base body 21. The light-transmitting member 24 is bonded around the upper end face 23a-side opening of the through hole 23b. Moreover, a through bore 21a is drilled all the way through from the upper principal surface to the lower principal surface of the base body 21. Fitted into the through bore 21a is an input/output terminal 25.

The input/output terminal 25 includes a plate portion 25b made of a dielectric substance; an upright wall portion 25a made of a dielectric substance; a line conductor 25c; and a metal plate 30. The plate portion 25b has, on its top surface, the line conductor 25c formed so as to extend from one edge to another edge opposite thereto of the top surface. The upright wall portion 25a is joined to the top surface of the plate portion 25b, with the line conductor 25c sandwiched therebetween. The input/output terminal 25 is constituted in such a manner that the plate portion 25b and the upright wall portion 25a are mounted on the metal plate 30. An optical semiconductor element 22 is mounted, through a base 28 made of an aluminum nitride (AlN) ceramic, at the front end of the metal plate 30 which faces an inside of the optical semiconductor apparatus.

The base body 21 is formed of a disk- or rectangular-shaped plate made of a metal such as an iron (Fe)-nickel (Ni)-cobalt (Co) alloy or a copper (Cu)-Tungsten (W) alloy. The base body 21 has the through bore 21a drilled all the way through from the upper principal surface to the lower principal surface thereof, for inserting thereinto the input/output terminal 25 composed of the plate portion 25b made of a dielectric substance such as an alumina ($Al_2O_3$) ceramic; the upright wall portion 25a made of a dielectric substance such as an $Al_2O_3$ ceramic; and the metal plate 30 joined to a lower surface of the plate portion 25b. The input/output terminal 25 is inserted into the through bore 21a for bringing the optical semiconductor apparatus into conduction externally. A brazing filler material such as silver (Ag) brazing filler is charged into a gap between the input/output terminal 25 and the through bore 21a, so that the base body 21 and the input/output terminal 25 may be hermetically joined to each other by brazing. With the metal plate 30, heat emanating from the optical semiconductor element 22 can be transmitted to the base body 21 satisfactorily, and then dissipated from the base body 21 and the lid body 23 satisfactorily. Hence, good heat dissipation can be provided and thus the optical semiconductor element 22 exhibits higher operation reliability.

Moreover, the plate portion 25b and the upright wall portion 25a of the input/output terminal 25 are fabricated as follows. For example, in the case of using an $Al_2O_3$ ceramic, at first, a suitable organic binder, plasticizer, or solvent is mixedly added to powder of a base material such as aluminum oxide, silicon oxide ($SiO_2$), magnesium oxide (MgO), or calcium oxide (CaO), to form a slurry. The slurry is then formed into a plurality of ceramic green sheets in accordance with a conventionally-known tape forming technique such as a doctor blade method or calendar roll method. Next, a suitable organic binder, plasticizer, or solvent is mixedly added to powder of a high-melting-point metal, such as W or molybdenum (Mo), to form a metal paste. The metal paste is then print-coated onto the ceramic green sheet in accordance with a thick-film forming technique, such as a screen printing method, to form a metallized wiring layer acting as the line conductor 25c with a predetermined pattern. Moreover, the plate portion 25b has its lower surface wholly print-coated with a metallized layer so that the metal plate 30 may be brazed thereto with use of Ag brazing filler or the like material. After that, a plurality of ceramic green sheets are stacked one upon another, and the stacked body is fired in a reducing atmosphere at a temperature an high as approximately 1600° C. In this way, the line conductor 25c is formed in the input/output terminal 25, with the characteristic impedance matched properly.

The metal plate 30 is formed in a rectangular shape and is made of a metal such as an Fe—Ni—Co alloy or Cu—W alloy. By subjecting an ingot of such a metal to a conventionally-known metal processing method, such as a rolling process or die cutting process, the metal plate 30 is formed in a predetermined configuration. On the principal surface of the metal plate 30 on which the plate portion 25b is mounted, the rectangular parallelepiped base 28 made of an AlN ceramic is brazed to the front end thereof facing an inside of the optical semiconductor apparatus with use of Ag brazing filler or the like material, for mounting thereon the optical semiconductor element 22.

Moreover, at the outer periphery of the upper principal surface of the base body 21 is disposed the cylindrically shaped lid body 23 composed of the upper end face 23a having the through hole 23b formed at the center thereof and the lower end left opened. The lower end 23c of the lid body 23 is air-tightly joined to the base body 21 by welding or soldering using solder such as lead (Pb)-tin (Sn) solder.

The cylindrically shaped lid body 23 has a circular or polygonal, such as rectangular, sectional profile (cross-sectional profile). The lid body 23 is formed in a predetermined configuration by subjecting an ingot of a metal such as an Fe—Ni—Co alloy to a conventionally-known metal processing method such as the rolling process or die cutting process.

In the lid body 23, the light-transmitting member 24 is bonded around the upper end face 23a-side opening of the through hole 23b so as to stop up the through hole 23b by glass bonding or soldering. The light-transmitting member 24 is made of glass or sapphire having the shape of a disk, lens, sphere, or hemisphere.

Moreover, the optical fiber 26 is fixed onto an upper end face of a cylindrically shaped fixing member 27 made of a metal such as an Fe—Ni—Co alloy. The metal-made fixing member 27 has its lower end face welded to the outer peripheral surface of the lid body 23 by laser welding or the like method. Upon the optical fiber 26 being fixed above the light-transmitting member 24 by the metal-made fixing member 27, the optical semiconductor apparatus is available as a finished product. Whereupon, optical signals are transferable between the optical semiconductor element 22 contained within the optical semiconductor apparatus and the outside thereof through the optical fiber 26 (for example, refer to Japanese Unexamined Patent Publication JP-A 2003-198028).

In the conventional construction, however, in achieving sealing, the input/output terminal 25 cannot be joined to the base body 21 without being inserted into the through bore 21a. Therefore, the through bore 21a, as well as the metal plate 30, the plate portion 25b, and the upright wall portion 25a of the input/output terminal 25, need to be designed with high dimensional and assembly accuracy. This necessitates an additional process in the processing on the through bore 21a and the input/output terminal 25 to attain high dimensional accuracy, and thus leads to poor mass-productivity of the base body 21 and the input/output terminal 25.

In addition, the input/output terminal 25 projects beyond a lower surface of the base body 21, which results in the difficulty in satisfying the recent demand for further miniaturization.

SUMMARY OF THE INVENTION

The invention has been devised in view of the above-described problems with the conventional art, and accordingly its object is to provide a package for housing an optical semiconductor element and an optical semiconductor apparatus that are excellent in mass-productivity, down-sizing, heat-dissipation, and operation reliability of an optical semiconductor element contained therein.

The invention provides a package for housing an optical semiconductor element comprising:

a base body made of a platy metal having a through bore drilled all the way through from an upper principal surface to a lower principal surface thereof;

a lid body formed in a cylindrical shape and made of a metal, the lid body including an upper end face having a through hole formed therein and a lower end which is left opened and joined to an outer periphery of the upper principal surface of the base body;

a light-transmitting member bonded around an opening of the through hole of the lid body; and an input/output terminal joined to the upper principal surface of the base body so as to cover the through bore, the input/output terminal including:

a first plate portion formed of a dielectric substance, which is disposed uprightly on the upper principal surface of the base body so as to lie across the through bore;

a line conductor formed on one principal surface of the first plate portion so as to extend from one base body-side edge to another edge opposite thereto of the one principal surface;

a second plate portion formed of a dielectric substance, which is stacked on the one principal surface of the first plate portion, with its one base body-side end face made flush with the first plate portion;

a metal plate formed so as to be made higher than the first plate portion, which is stacked on another principal surface of the first plate portion, with its one base body-side end face made flush with the first plate portion; and a lead terminal attached to a part of a lower surface of the input/output terminal which lies inside the through bore, the lead terminal being electrically connected to the line conductor.

According to the invention, the input/output terminal includes a first plate portion formed of a dielectric substance, which is disposed uprightly on the upper principal surface of the base body so as to lie across the through bore; a line conductor formed on one principal surface of the first plate portion so as to extend from one base body-side edge to another edge opposite thereto of the one principal surface; a second plate portion formed of a dielectric substance, which is stacked on the one principal surface of the first plate portion, with its one base body-side end face made flush with the first plate portion; a metal plate formed so as to be made higher than the first plate portion, which is stacked on another principal surface of the first plate portion, with its one base body-side end face made flush with the first plate portion; and a lead terminal attached to a part of a lower surface of the input/output terminal which lies inside the through bore, the lead terminal being electrically connected to the line conductor. Therefore, in contrast to a conventional package for housing an optical semiconductor element, there is no need to insert the input/output terminal into the through bore. That is, in order for the input/output terminal to be joined to the base body, all that needs to be done is to bond one end face of the input/output terminal to the upper principal surface of the base body around the through bore. Thus, allowance can be made for the dimensional accuracy of the through bore and the input/output terminal. As a result, no additional process is required in the processing on the through bore and the input/output terminal to attain high dimensional accuracy; wherefore the base body and the input/output terminal can be produced with ease. The package for housing the optical semiconductor element of the invention can accordingly be fit for mass-production.

Moreover, since the input/output terminal does not jut out from the lower surface of the base body, it is possible to keep up with the recent trend for miniaturization.

Further, since the lead terminal can be attached coaxially with the line conductor, it follows that no flection appears in the connection portion between the lead terminal and the line conductor, in consequence whereof there results no abrupt change in impedance. Hence, the transmission characteristics can be enhanced remarkably.

In addition, heat generated at the time of operating the optical semiconductor element is properly transmitted through the metal plate to the base body at all times. By this effect, the heat can be dissipated efficiently from the base body and the lid body to the outside, and thus temperature rise occurring in the optical semiconductor element can be suppressed, and the optical semiconductor element can be prevented from malfunctioning. Hence, in the package for housing the optical semiconductor element, the optical semiconductor element can be normally operated with stability for a longer period of time.

The invention provides a package for housing an optical semiconductor element comprising:

a base body made of a platy metal having a through bore drilled all the way through from an upper principal surface to a lower principal surface thereof;

a lid body formed in a cylindrical shape and made of a metal, the lid body including an upper end face having a through hole formed therein and a lower end which is left opened and joined to an outer periphery of the upper principal surface of the base body;

a light-transmitting member bonded around an opening of the through hole of the lid body; and an input/output terminal joined to the upper principal surface of the base body so as to cover the through bore, the input/output terminal including:

a first plate portion formed of a dielectric substance, which is disposed uprightly on the upper principal surface of the base body so as to lie across the through bore;

a line conductor formed on one principal surface of the first plate portion so as to extend from one base body-side edge to another edge opposite thereto of the one principal surface;

a second plate portion formed of a dielectric substance, which is stacked on the one principal surface of the first plate portion, with its one base body-side end face made flush with the first plate portion;

a metal plate formed so as to be made higher than the first plate portion, which is stacked on another principal surface of the first plate portion, with its one base body-side end face inserted into the through bore so as to jut out below the first plate portion and the lower principal surface of the base body; and a lead terminal attached to a part of a lower surface of the input/output terminal which lies inside the through bore, the lead terminal being electrically connected to the line conductor.

According to the invention, the input/output terminal includes a first plate portion formed of a dielectric substance, which is disposed uprightly on the upper principal surface of the base body so as to lie across the through bore; a line conductor formed on one principal surface of the first plate portion so as to extend from one base body-side edge to another edge opposite thereto of the one principal surface; a second plate portion formed of a dielectric substance, which is stacked on the one principal surface of the first plate portion, with its one base body-side end face made flush with the first plate portion; and a metal plate formed so as to be made higher than the first plate portion, which is stacked on another principal surface of the first plate portion, with its one base body-side end face inserted into the through bore so as to jut out below the first plate portion and the lower principal surface of the base body. Therefore, all that needs to be inserted into the through bore to join is the metal plate, and thus the first and second plate portions each made of a sintered dielectric substance, which is difficult to be controlled in the dimensional accuracy after being sintered, can be joined to the base body simply by bonding their base body-side end faces to the upper principal surface of the base body around the through bore. Hence, allowance can be made for the dimensional and assembly accuracy of those components. As a result, no additional process is required in the processing on the input/output terminal to attain high dimensional accuracy; wherefore the input/output terminal can be produced with ease. The package for housing the optical semiconductor element of the invention can accordingly be fit for mass-production.

Moreover, the bottom end of the metal plate that is coplanarly continuous with the top end to which the optical semiconductor element is attached is so formed as to jut out below the base body, and this jutting part is virtually recognized from the underneath of the package for housing the optical semiconductor element. Hence, by assembling the components such as the lid body with reference to the jutting part, it is possible to facilitate positional alignment with respect to the optical semiconductor element within the package for housing the optical semiconductor element. Besides, in mounting the package for housing the optical semiconductor element in an external electric circuit board, positional alignment can be achieved with ease between the optical semiconductor element packaged in the package for housing the optical semiconductor element and the external electric circuit board.

Further, in the metal plate having the optical semiconductor element attached to its front end, by imparting good heat-dissipation property to that part of metal plate which juts out below the base body, heat emanating from the optical semiconductor element can be dissipated efficiently through the metal plate.

In the invention, in the input/output terminal, a notch is formed in a part of one base body-side end face of the second plate portion which is contiguous to the line conductor so that one end of the line conductor is exposed, and the lead terminal is electrically connected to the one end of the line conductor.

According to the invention, it is preferable that, in the input/output terminal, a notch is formed in a part of one base body-side end face of the second plate portion which is contiguous to the line conductor so that one end of the line conductor is exposed, and that the lead terminal is electrically connected to the one end of the line conductor. In this construction, since the bonding area between the lead terminal connected in a depth direction of the notch and the line conductor can be made as wide as possible, it follows that the lead terminal is firmly joined to the line conductor. At the same time, forming the notch makes it possible to decrease the possibility of occurrence of high-frequency impedance mismatch in the line conductor part; wherefore a high-frequency signal can be transmitted through the line conductor part with significantly high efficiency.

In the invention, another other end face of the metal plate opposite to one base body-side end face thereof is shaped into a slant surface.

According to the invention, it never occurs that light reflected from the slant surface travels toward an optical fiber and the optical semiconductor element, undergoing multi-reflection in other parts, and the resultant reflection light induces noise in an optical signal which passes between the optical semiconductor element and the optical fiber, in consequence whereof there results no high possibility of deterioration in S/N ratio of the optical signal.

The invention further provides an optical semiconductor apparatus comprising:

the package as set forth hereinabove; and an optical semiconductor element attached to the exposed top end of the first plate portion-side surface of the metal plate so as to be electrically connected to the line conductor, wherein a lower end of the lid body is joined to the outer periphery of the upper principal surface of the base body in a state where the light-transmitting member attached thereto faces a light-receiving or light-emitting portion of the optical semiconductor element.

According to the invention, the optical semiconductor apparatus includes the package for housing the optical semiconductor element as set forth hereinabove; and the optical semiconductor element attached to the exposed top end of the first plate portion-side surface of the metal plate so as to be electrically connected to the line conductor; and a lower end of the lid body is joined to the outer periphery of the upper principal surface of the base body in a state where the light-transmitting member attached thereto faces the light-receiving or light-emitting portion of the optical semiconductor element. With use of the package for housing the optical semiconductor element of the invention, the optical semiconductor apparatus will be excellent in mass-productivity, down-sizing, heat-dissipation, and operation reliability of the optical semiconductor element contained therein.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1:
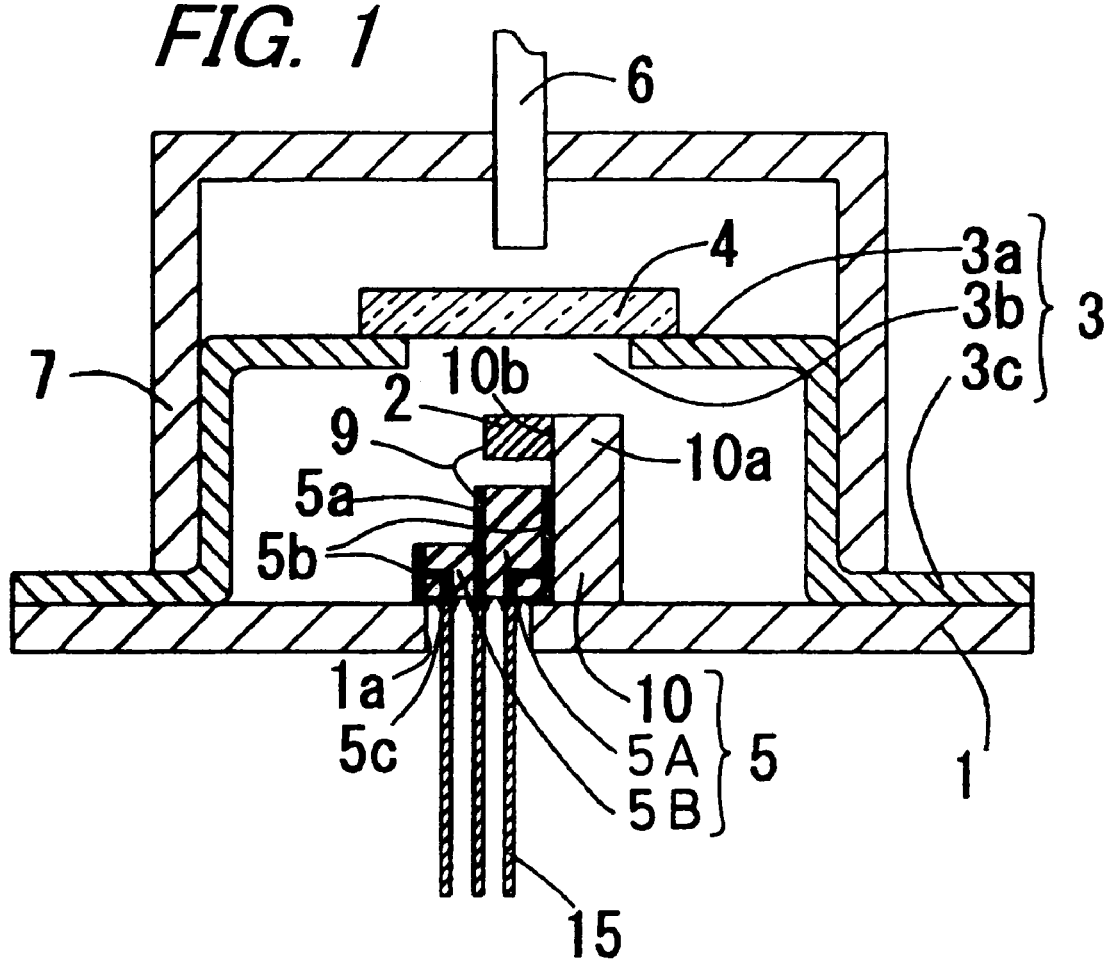
FIG. 1 is a sectional view showing a package for housing an optical semiconductor element and an optical semiconductor apparatus according to a first embodiment of the invention.

Now referring to the drawings, preferred embodiments of the invention are described below.

Hereinafter, a package for housing an optical semiconductor element and an optical semiconductor apparatus embodying the invention will be described in detail. FIG. 1 is a sectional view showing a package for housing an optical semiconductor element and an optical semiconductor apparatus according to a first embodiment of the invention.

In FIG. 1, reference numeral 1 represents a base body; reference numeral 2 represents an optical semiconductor element; reference numeral 3 represents a metal-made lid body; reference numeral 4 represents a light-transmitting member; reference numeral 5 represents an input/output terminal; and reference numeral 6 represents an optical fiber. The package for housing the optical semiconductor element is basically composed of the base body 1; the input/output terminal 5; and the lid body 3. Moreover, upon the optical semiconductor element 2 being mounted in the package for housing the optical semiconductor element, and the lid body 3 having the light-transmitting member 4 bonded thereto being air-tightly joined to the base body, the optical semiconductor apparatus is realized.

As shown in FIG. 1, the package for housing the optical semiconductor element of the invention includes the base body 1 made of a platy metal; the lid body 3 made of a input/output terminal 5. The base body 1 has a through bore 1a drilled all the way through from an upper principal surface to a lower principal surface thereof. The lid body 3 includes an upper and face having a through hole 3b formed at the center thereof and a lower and which is left opened and joined to the outer periphery of the upper principal surface of the base body 1. The light-transmitting member 4 is bonded around the opening of the through hole 3b of the lid body 3. The input/output terminal 5 is joined to the upper principal surface of the base body 1 so as to cover the through bore 1a.

The input/output terminal 5 includes a first plate portion 5A; a line conductor 5a; a second plate portion 5B; and a metal plate 10. The first plate portion 5A is formed of a rectangular dielectric substance, which is disposed uprightly on the upper principal surface of the base body 1 so as to lie across the through bore 1a. The line conductor 5a is formed on one principal surface of the first plate portion 5A so as to extend from one base body 1-side edge to another opposite edge of the one principal surface. The second plate portion 5B is formed of a rectangular dielectric substance, which is stacked on the one principal surface of the first plate portion 5A, with its one base body 1-side end face made flush with the one base body 1-side end face of the first plate portion 5A. Here, the second plate portion 5B is formed so as to be made lower than the first plate portion 5A. The metal plate 10 is formed in a rectangular shape and is made higher than the first plate portion 5A, which is stacked on the other principal surface of the first plate portion 5A, with its one base body 1-side end face made flush with the one base body 1-side end face of the first plate portion 5A. A lead terminal 15 is attached to a part of a lower surface of the input/output terminal 5 which faces the through bore 1a so as to be electrically connected to the line conductor 5a.

In the invention, the base body 1 is formed of a disk- or polygonal, such as rectangular, hexagonal and octagonal-shaped plates. By subjecting an ingot of a metal such as an Fe—Ni—Co alloy, Cu—W alloy, or Cu—Mo alloy to a conventionally-known metal processing method such as the rolling process or die cutting process, the base body 1 is formed in a predetermined configuration.

Moreover, the base body 1 has the through bore 1a formed at the center thereof. When a metallized layer formed on the lower surface of the input/output terminal 5 is joined to the upper principal surface of the base body 1 around the through bore 1a with use of a brazing filler material such da silver (Ag) brazing filler, the through bore 1a is stopped up, and thereby the input/output terminal 5 is air-tightly bonded.

In the invention, as shown in FIG. 1, the input/output terminal 5 has the line conductor 5a formed so as to extend from one base body 1-side edge to the other edge thereof, and has its lower surface joined to the upper principal surface of the base body 1 around the through bore 1a so as to direct the input/output terminal 5 in a direction perpendicular to the base body 1. Note that a ground conductor 5b may alternatively be disposed on another principal surface of the first plate portion 5A, and on one principal surface and a side face of the second plate portion 5B, which one principal surface of the second plate portion 5B is opposite to another principal surface thereof facing the first plate portion 5A. In this construction, even when a high-frequency signal is transmitted through the line conductor 5a, it is possible to minimize occurrence of a transmission loss such as reflection loss.

The ground conductor 5b, which is formed on the surface of the first plate portion 5A opposite to the line conductor 5a-side principal surface thereof, serves also as a connection portion for brazing the metal plate 10 to the first plate portion 5A with use or a brazing filler material such as Ag brazing filler.

The first and second plate portions 5A and 5B are each made of a dielectric substance such as an $Al_2O_3$-based sintered body, an AlN-based sintered body, or a mullite ($3Al_2O_3.2SiO_2$)-based wintered body. The line conductor 5a is formed of a W— or Mo-made metallized layer.

The first and second plate portions 5A and 5B such as shown herein are fabricated as follows. For example, in the case of forming the first and second plate portions 5A and 5B of an $Al_2O_3$-based sintered body, at first, a suitable organic binder, plasticizer, or solvent is mixedly added to powder of a base material such as aluminum oxide ($Al_2O_3$), silicon oxide ($SiO_2$), magnesium oxide (MgO) or calcium oxide (CaO), to form a slurry. The slurry is then formed into a plurality of ceramic green sheets in accordance with a conventionally-known tape forming technique, such as the doctor blade method or calendar roll method. Next, a suitable organic binder, plasticizer, or solvent is mixedly added to powder of a high-melting-point metal, such as W or Mo, to form a metal paste. The metal paste is then print-coated onto the ceramic green sheet in accordance with a thick-film forming technique, such as the screen printing method, to form a metallized layer acting as the line conductor 5a with a predetermined pattern. Moreover, in order for the input/output terminal 5 to be brazed to the base body 1 with use of a brazing filler material such as Ag brazing filler, a metallized layer is also formed in the connection portion between the base body 1 and the first and second plate portions 5A and 5B, with a predetermined pattern, in the same manner as the line conductor 5a. After that, a plurality of ceramic green sheets are stacked one upon another, and the stacked body is fired in a reducing atmosphere at a temperature as high as approximately 1600° C.

The first and second plate portions 5A and 5B may alternatively be fabricated as follows. In contrast to the above described way, a metallized layer for providing connection with the base body 1 is not formed at one through bore 1a-side end faces of the first and second plate portions 5A and 5B. In this state, firing is performed. Upon completion of the firing, the surface of the stacked body of the first and second plate portions 5A and 5B is subjected to a slicing process or polishing process. Then, the sliced or polished surface is print-coated with a metal paste predominantly composed of W, Mo, or the like material in accordance with a thick-film forming technique such as the screen printing method. Lastly, the stacked body is fired in a reducing atmosphere at a temperature as high as approximately 1300° C. In this way, the surface of the stacked body of the first and second plate portions 5A and 5B becomes flattened; wherefore the first and second plate portions 5A and 5B can be joined to the base body 1 more satisfactorily.

Moreover, the first plate portion 5A has its surface opposite to the line conductor 5a-side principal surface joined to the metal plate 10 made of a metal such as a Cu—W alloy or Cu—Mo alloy. The metal plate 10 has a projection 10a which juts out beyond the upper surface of the first plate portion 5A on a side of the other end opposite to the base body 1-side end of the input/output terminal 5. The projection 10a has, on its first plate portion 5A-side exposed surface, a mounting portion 10b for mounting thereon the optical semiconductor element 2. In this construction, the package for housing the optical semiconductor element of the invention can dissipate efficiently heat generated at the time of operating the optical semiconductor element 2 from the metal plate 10 to the outside through the base body 1 and the lid body 3. This makes it possible to suppress temperature rise occurring in the optical semiconductor element 2 due to heat accumulation, and thereby prevent the optical semiconductor element 2 from malfunctioning. Hence, it is possible to realize the package for housing the optical semiconductor element in which the optical semiconductor element 2 can be normally operated with stability for a longer period of time.

The metal plate 10, which is made of a rectangular-shaped metal such as a Cu—W alloy or Cu—Mo alloy, is formed in a predetermined configuration by subjecting an ingot of such a metal to a conventionally-known metal processing method such as the rolling process or die cutting process.

Preferably, the metal plate 10 and the base body 1 are each made of a Cu—Mo alloy which exhibits excellent thermal conductivity. By doing so, heat emanating from the optical semiconductor element 2 can be dissipated more efficiently to the outside through the metal plate 10 and the base body 1 each made of a Cu—Mo alloy. As a result, it is possible to successfully prevent occurrence of temperature rise in the optical semiconductor element 2 due to heat accumulation, and thereby prevent the optical semiconductor element 2 from malfunctioning. Hence, it is possible to realize the package for housing the optical semiconductor element in which the optical semiconductor element 2 can be normally operated with stability for a longer period of time.

Thereupon, two pieces of samples of the package for housing the optical semiconductor element were actually made, of which one (defined as Sample A) employs a Cu W alloy as a material to form the metal plate 10 and the base body 1, whereas the other (defined as Sample B) employs a Cu—Mo alloy as a material to form the metal plate 10 and the base body 1. In each of Samples A and B, an LD was mounted as the optical semiconductor element 2 on the mounting portion 10b of the metal plate 10. Then, under conditions of continuous operation for 100 hours, the maximum temperature of the surface of the LD in action was measured. The result is that, in Sample A, the maximum temperature of the LD surface was 78.2° C., whereas in Sample B, the maximum temperature of the LD surface was 74.4° C. It has thus been confirmed that the use of a Cu—Mo alloy for forming the metal plate 10 and the base body 1 makes it possible to attain a better heat-dissipation effect.

Moreover, a Cu Mo alloy is more pliable than a Cu—W alloy and thus lends itself to a die cutting process using a die. Therefore, by forming the metal plate 10 and the base body 1 of a Cu—Mo alloy, they can be produced in large quantities more efficiently through the die cutting process, thus achieving excellent mass-productivity.

The input/output terminal 5 such as shown herein is, at its lower surface, joined to the upper principal surface of the base body 1 around the through bore 1a so as to direct the input/output terminal 5 in a direction perpendicular to the base body 1. In this construction, in contrast to the conventional package for housing the optical semiconductor element, there is no need to insert the input/output terminal 5 into the through bore 1a, and thus allowance can be made for the dimensional accuracy of the through bore 1a and the input/output terminal 5. As a result, no additional process is required in the processing on the through bore 1a, as well as the metal plate 10 and the first and second plate portions 5A and 5B of the input/output terminal 5, to attain high dimensional and assembly accuracy; wherefore the base body, 1 and the input/output terminal 5 can be produced with ease. The package for housing the optical semiconductor element of the invention will accordingly be fit for mass-production.

Moreover, since the input/output terminal 5 does not jut out from the lower surface of the base body 1, it is possible to keep up with the recent trend for miniaturization.

Figure 2:
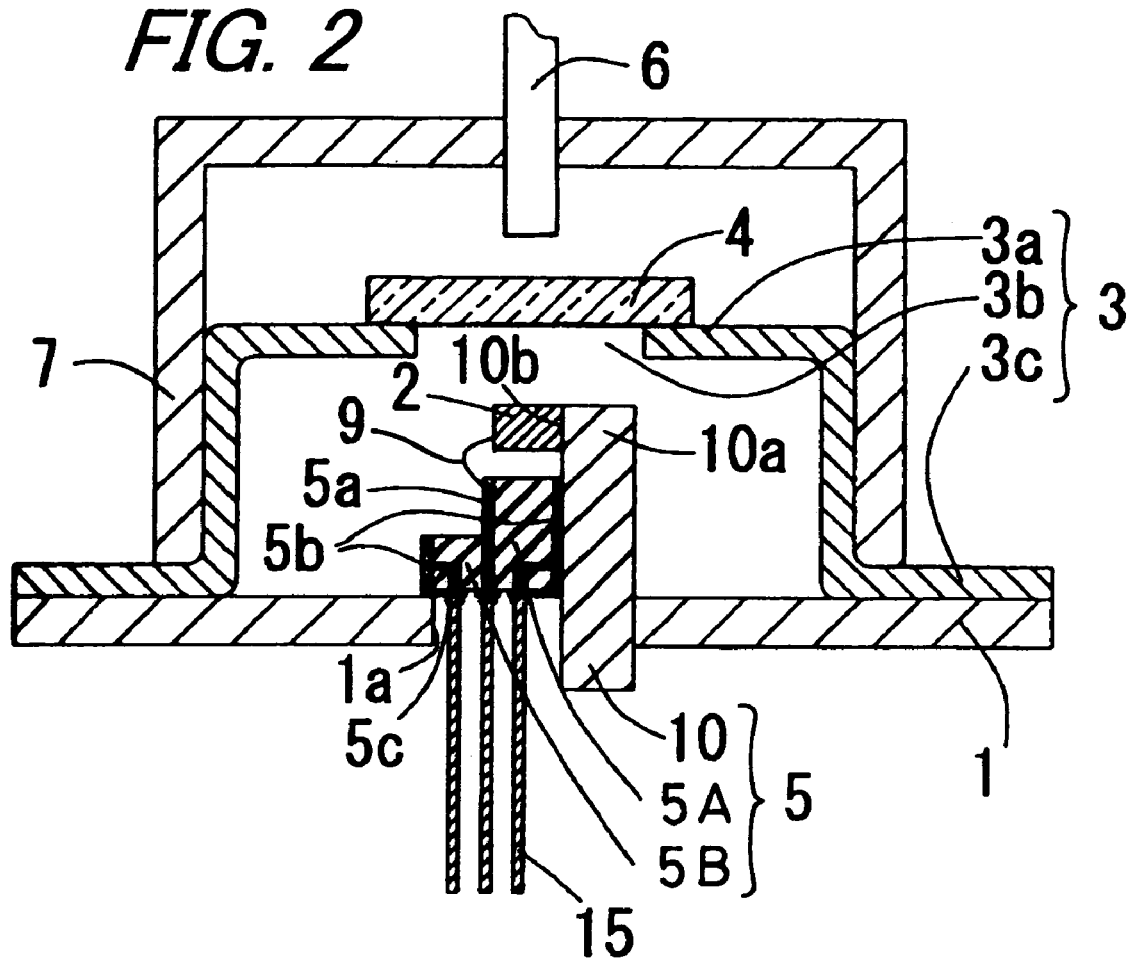
FIG. 2 is a sectional view showing a package for housing an optical semiconductor element and an optical semiconductor apparatus according to a second embodiment of the invention.

FIG. 2 is a sectional view showing a package for housing an optical semiconductor element and an optical semiconductor apparatus according to a second embodiment of the invention. In this embodiment, the rectangular-shaped metal plate 10 of the input/output terminal 5 is made higher than the first plate portion 5A so as to jut out beyond the upper surface of the first plate portion 5A on the side or the other end opposite to the one base body 1-side end of the input/output terminal 5. The metal plate 10 is stacked on the other principal surface of the first plate portion 5A, with its one base body 1-side and ace (one end face at the lower part of the metal plate 10) inserted into the through bore 1 so as to jut out below the one base body 1-side end face of the first plate portion 5A and the lower principal surface of the base body 1. In the metal plate 10, a part of the first plate portion 5A-side surface which is continuous with the surface having the optical semiconductor element 2 attached to its front end is so formed as to jut out below the base body 1. That is, this part is exposed outside the package for housing the optical semiconductor element.

In this construction, all that needs to be inserted into the through bore 1*a* to join is the metal plate 10 that can readily be processed with high accuracy by machining or the like operation. Therefore, the first and second plate portions 5A and 5B made of a sintered dielectric substance, which is difficult to be controlled in the dimensional accuracy after being sintered, can be joined to the base body 1 simply by bonding their base body 1-side end faces to the upper principal surface of the base body 1 around the through bore 1*a*, and thus allowance can be made for the dimensional and assembly accuracy of those components. As a result, there will be no need to perform an additional process in the processing on the input/output terminal 5 to attain high dimensional accuracy; wherefore the input/output terminal 5 can be produced with ease. The package for housing the optical semiconductor element of the invention can accordingly be fit for mass-production.

Moreover, in this construction, the metal plate 10 is so designed that the bottom end (one-end part) which is coplanarly continuous with the top end (another-and part) to which the optical semiconductor element 2 is attached juts out below the lower principal surface of the base body 1. By assembling the components such as the lid body 3 and a fixing member 7 having an optical fiber 6 fixed thereto with reference to this jutting part, it is possible to facilitate positional alignment with respect to the optical semiconductor element 2 packaged in the package for housing the optical semiconductor element of the invention. Further, in mounting the package for housing the optical semiconductor element of the invention in an external electric circuit board (not shown), positional alignment can be achieved with ease between the optical semiconductor element 2 packaged in the package for housing the optical semiconductor element and the external electric circuit board.

In order to attain the above objective, for example, positioning of the mounting portion 10*b* for mounting thereon the optical semiconductor element 2 that is disposed on the projection 10*a* at the top end of the first plate portion 5A-side surface of the metal plate 10, or positioning of the optical semiconductor element 2 when attached to the mounting portion 10*b* should preferably be made with reference to two corners of a part of the lower end of the metal plate 10 which juts out below the lower principal surface of the base body 1, more desirably, two corners of the part of the lower end of the metal plate 10 which is contiguous to the first plate portion 5A, or two position markers disposed in such a region or disposed within the first plate portion 5A-side surface of that part of the metal plate 10 which can be visually recognized from the underneath of the package for housing the optical semiconductor element. In this way, the position of the optical semiconductor element 2 attached to the top end at the metal plate 10 can be identified on the basis of the two corners lying outside of the package for housing the optical semiconductor element or the two position markers, as well as the position of the first plate portion 5A-side surface of the metal plate 10. Hence, assembly of the components such as the lid body 3 of the package for housing the optical semiconductor element and the fixing member 7 to which the optical fiber 6 is fixed; alignment between the optical semiconductor element 2 and the optical fiber 6, and positional alignment necessary for the package for housing the optical semiconductor element to be mounted in the external electric circuit board can be facilitated respectively.

Moreover, with the structure thus far described, it is possible to dissipate heat emanating from the optical semiconductor element 2, through a part of the metal plate 10 which juts out below the base body 1, i.e. the part free of the base body 1, directly into the external electric circuit or a cooling system disposed in the external electric circuit; wherefore the heat emanating from the optical semiconductor element 2 can be dissipated more efficiently.

Figure 3:
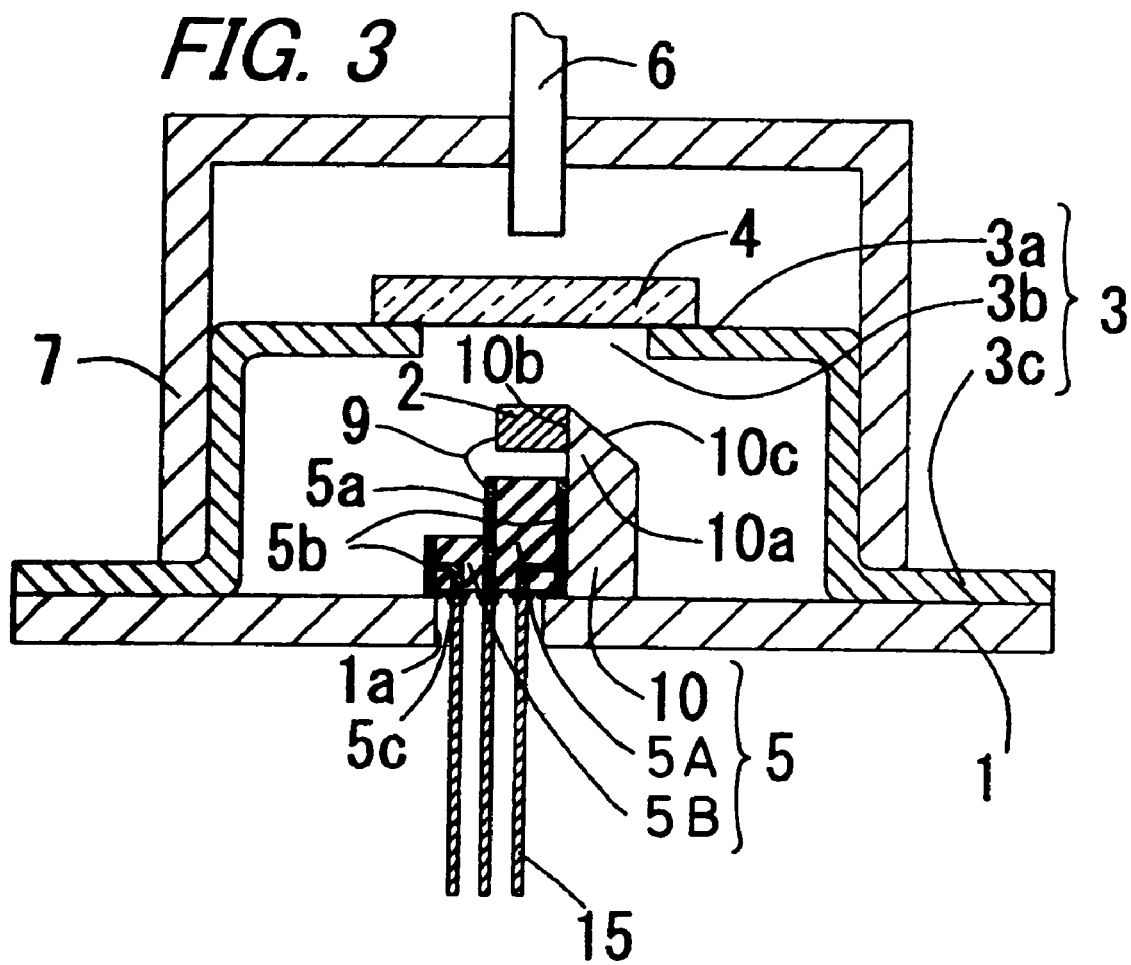
FIG. 3 is a sectional view showing a package for housing an optical semiconductor element and an optical semiconductor apparatus according to a third embodiment of the invention.

FIG. 3 is a sectional view showing a package for housing an optical semiconductor element and an optical semiconductor apparatus according to a third embodiment of the invention. More preferably, as shown in FIG. 3, it is preferable that the projection 10*a*-side top and face of the metal plate 10 (another end face of the metal plate 10 opposite to one base body 1-side end face thereof) is shaped into a slant surface 10*c* which is slant downwardly toward another principal surface opposite to the mounting portion 10*b* so that light scattered from a light path connecting the optical fiber 6 and the light-emitting portion or light-receiving portion of the optical semiconductor element 2, is not reflected toward the optical fiber 6 and the light-emitting portion or light-receiving portion of the optical semiconductor element 2. By doing so, it never occurs that the light reflected from the slant surface 10*c* travels toward the optical fiber 6 and the optical semiconductor element 2, undergoing multi-reflection in other parts, and the resultant reflection light induces noise in an optical signal which passes between the optical semiconductor element 2 and the optical fiber 6, in consequence whereof there results no high possibility of deterioration in S/N ratio of the optical signal.

Moreover, the input/output terminal 5 has, on its part lying inside the through bore 1*a*, a connection pad 5*c* formed of a metallized layer predominantly composed of a high-melting-point metal such as W or Mo, for providing electrical connection between the lead terminal 15 and the line conductor 5*a* or ground conductor. To the connection pad 5*c* is joined the lead terminal 15 made of a metal such as an Fe—Ni—Co alloy. Upon the lead terminal 15 having electrically connected to an external electric circuit such a an external electric circuit board, input and output or electric signals can be made between the optical semiconductor element 2 and the external electric circuit. Note that the lead terminal 15 is formed in a predetermined rod like configuration by subjecting an ingot of a metal such as an Fe—Ni—Co alloy to a conventionally known metal processing method such as the rolling process or die cutting process.

Figure 4:
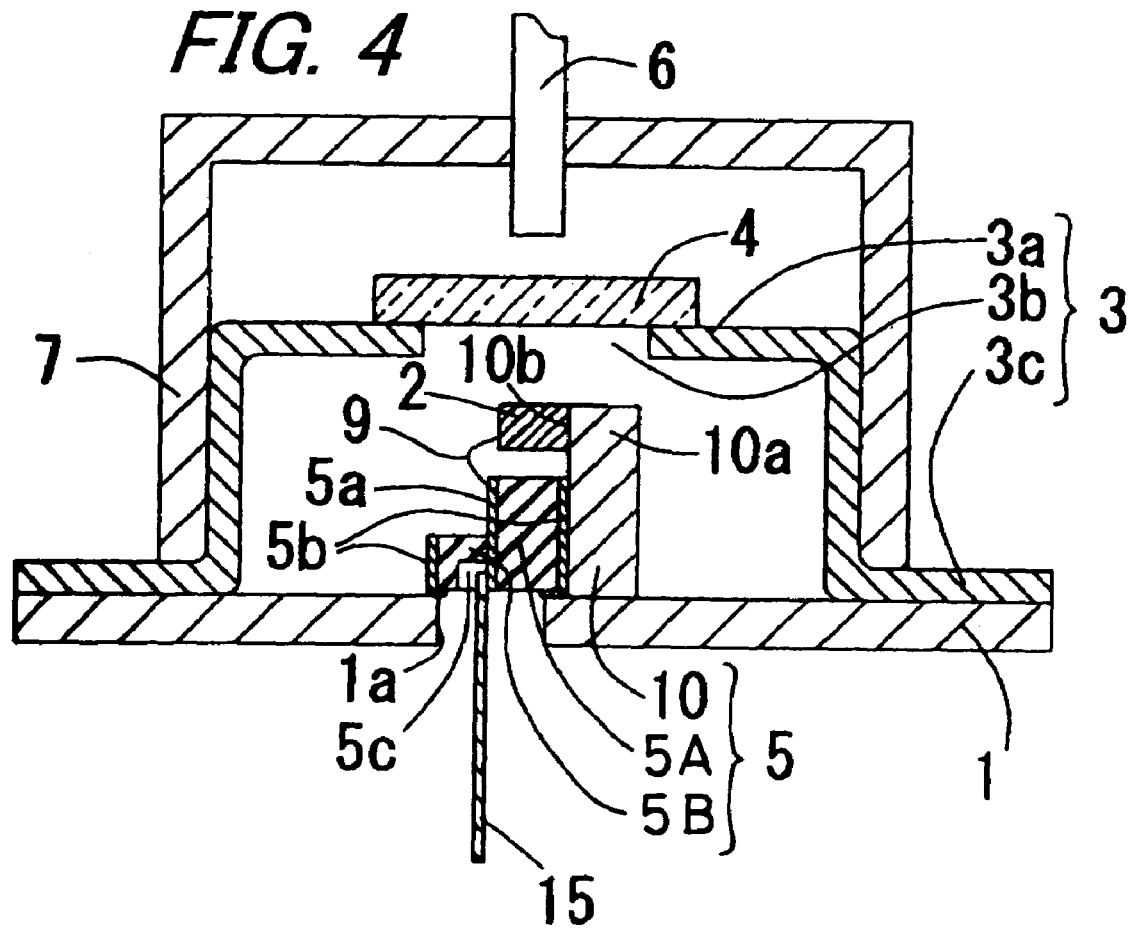
FIG. 4 is a sectional view showing a package for housing an optical semiconductor element and an optical semiconductor apparatus according to a fourth embodiment of the invention.
Figure 5:
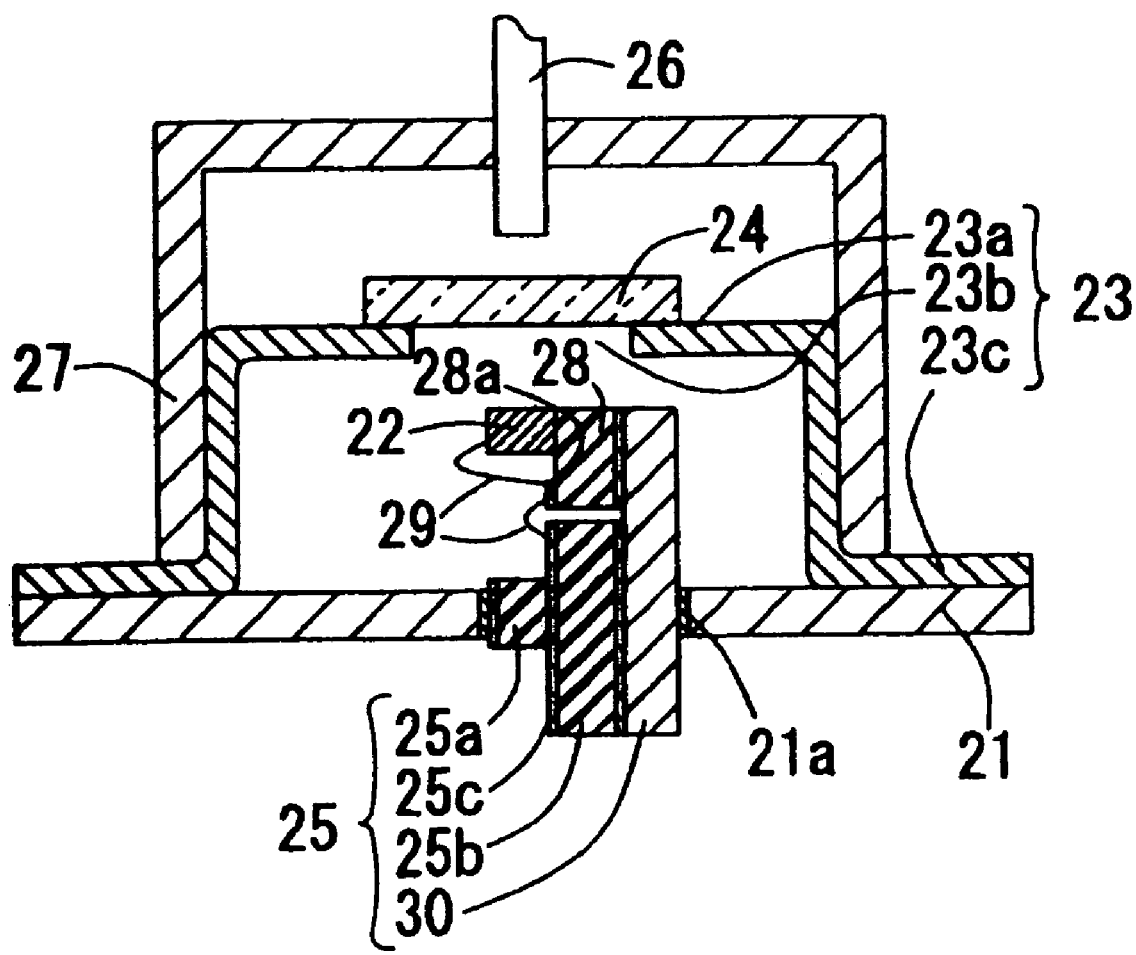
FIG. 5 is a sectional view showing an example of a conventional package for housing an optical semiconductor element.

FIG. 4 is a sectional view showing a package for housing an optical semiconductor element and an optical semiconductor apparatus according to a fourth embodiment of the invention. As shown in FIG. 4, as another example of the invention, illustrating how the lead terminal 15 is connected to the input/output terminal 5, a notch 5c is formed near a part of one base body 1-side end of the second plate portion 5B which is contiguous to the line conductor 5a so that one end of the line conductor 5a is exposed. The lead terminal 15 made of a metal such as an Fe—Ni—Co alloy is electrically connected to the exposed one-end part of the line conductor be with use of a brazing filler material or the like. In this case, there is no need to provide the connection pad 5c that would entail variation in the width of the line conductor 5a. There is also no need to create, at the front end of the lead terminal 15, a head portion whose thickness is greater than the diameter of the lead terminal 15 through a forming process (squashing process) to achieve proper connection between the connection pad 5c and the lead terminal 15. Hence, it never occurs that a high-frequency electric signal passing through the line conductor 5a is reflected from the connection portion due to an impedance mismatch, in consequence whereof there results no high possibility of troubles in conduction of the high-frequency electric signal.

Moreover, since the bonding area between the lead terminal 15 connected in the depth direction of the notch 5c and the line conductor 5a can be made as wide as possible, it follows that the lead terminal 15 is firmly joined to the line conductor 5a. At the same time, since the notch 5c is formed at a position where the lead terminal 15 and the line conductor 5a are connected to each other, the configuration of the notch 5c is preferably determined in such a way that its high-frequency impedance is set to an intermediate value between high-frequency impedance of a part of the line conductor 5a which is located above the notch 5c and covered with the plate portion 5B and high-frequency impedance of a part of the lead terminal 15 which is located below the base body 1. This helps lessen reflection of a high-frequency signal passing through the line conductor 5a due to an impedance mismatch, wherefore a high-frequency signal can be transmitted through the line conductor 5a part with significantly high efficiency.

Preferably, the notch of the second plate portion 5B is so shaped that its width becomes narrower gradually or step by step from one base body 1-side edge of the line conductor 5a, along the line conductor 5a, to the depth direction thereof. This helps suppress occurrence of an impedance mismatch in the connection portion. Likewise, the line conductor 5a is preferably so shaped that its width becomes narrower gradually or step by step.

Another advantage is that the lead terminal 15 can be attached coaxially with the line conductor 5a, and thus the lead terminal 15 and the line conductor 5a are connected in line with each other. Therefore, no reflection appears in the connection portion, in consequence whereof there results no abrupt change in impedance. The transmission characteristics can accordingly be enhanced remarkably.

Moreover, disposed at the outer periphery of the upper principal surface of the base body 1 is the lid body 3 formed in a cylindrical shape and including the upper end face 3a having the through hole 3b formed at the center thereof and the lower end 3c which is left opened. The lower end 3c of the lid body 3 is air-tightly joined to the base body 1 by welding or soldering using solder such as lead (Pb)-tin (Sn) solder. Note that, as shown in FIG. 1, the lower end 3c is preferably formed in a collar shape extending in a radial direction of the lid body 3, for the purpose of increasing the bonding area between the base body 1 and the lid body 3 to improve the hermeticity reliability of the package interior formed by combining the base body 1 and the lid body 3 together.

The cylindrically shaped lid body 3 has a circular or polygonal, such as rectangular, sectional profile (cross sectional profile). The lid body 3 is formed in a predetermined configuration by subjecting an ingot of a metal such as an Fe—Ni—Co alloy to a conventionally-known metal processing method such as the rolling process or die cutting process. Note that the lid body 3 may also be fabricated by combining together a cylinder portion and the upper end face 3a, which are provided separately, by brazing, soldering, welding, or the like method.

Moreover, in the lid body 3, the light-transmitting member 4 is bonded around the upper end face 3a-side opening of the through hole 3b so as to cover the through hole 3b by glass bonding, soldering, or the like method. The light-transmitting member 4 is made of glass or sapphire having the shape of a disk, lens, sphere, or hemisphere. The light-transmitting member 4 is joined to the lid body 3 at its circumferential strip portion (when sphere-shaped) or its principal surface's outer periphery (when disk- or lens shaped), or its flat surface's outer periphery (when hemisphere-shaped).

In the invention, by bonding the light-transmitting member 4 around the upper end face 3a-side opening of the through hole 3b the following advantage is gained. That is, if, at the time when the fixing member 7 is welded to the collar-shaped outer circumference of the lid body 3, the resultant heat is applied locally to the lid body 3, a thermal expansion-induced tensile stress will be applied to the bonding surface between the lid body 3 and the light-transmitting member 4. This may cause the light-transmitting member 4 to fall off the lid body 3. However, in the optical semiconductor apparatus, a pressure tends to be applied from the outer side to the inner side thereof because of its inside hermeticity. Hence, with the above-described configuration, the resultant pressure allows the light-transmitting member 4 to be pressed against the lid body 3; wherefore the light-transmitting member 4 is resistant to falling-off.

In order to complete the optical semiconductor apparatus, in the package for housing the optical semiconductor element, the optical semiconductor element 2 is fixedly mounted at the semiconductor element 2-mounting portion 10b disposed on the metal plate 10 with use of a low-melting-point brazing filler material such as Sn—Pb solder. Then, electrical connection is electrode of the optical semiconductor element 2 by electrical connecting means 9 such as a bonding wire. Lastly, the lid body 3 is joined to the outer periphery welding or the like method. Note that the second plate portion 5B is preferably made lower than the first plate portion 5A to expose the end of the line conductor 5a. This facilitates proper connection of the electrical connecting means 9.

Further, the cylindrically shaped fixing member 7 is, at its lower end face, joined to the collar-shaped outer circumference of the lid body 3 of the optical semiconductor apparatus by welding such as the laser welding method. The fixing member 7 is made of a metal such as an Fe—Ni—Co alloy and has the optical fiber 6 fixed to the upper end face thereof. In this way, the optical fiber 6 is secured above the light-transmitting member 4 by the fixing member 7, whereupon optical signals are transferable between the optical semiconductor element 2 contained within the apparatus and the outside through the optical fiber 6.

The optical semiconductor apparatus embodying the invention becomes able to function as an optical semiconductor apparatus for use in high-speed optical communications through the following series of steps. At first, the electrode of the optical semiconductor element 2 is electrically connected to the external electric circuit, so that light such as laser light may be excited in the optical semiconductor element 2 by an electric signal fed from the external electric circuit, for example. Subsequently, the resultant light is allowed to pass through the light-transmitting member 4 and the optical fiber 6 in the order named, and is then transmitted through the optical fiber 6 to the outside.

It is to be understood that the application of the invention is not limited to the specific embodiments described heretofore, and that many modifications and variations of the invention are possible within the spirit and scope of the invention. For example, the optical fiber 6 may be fixed to the fixing member 7 through a ferrule made of a ceramic. The lid body 3 may be bonded to the base body 1 through a metal seal ring to improve the sealing ability or workability.

The package for housing the optical semiconductor element and the optical semiconductor apparatus embodying the invention are useable as a package for housing an optical semiconductor element and an optical semiconductor apparatus for accommodating therein an optical semiconductor element that generates a large quantity of heat during operation.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A package for housing an optical semiconductor element comprising:

a base body made of a platy metal having a through bore drilled all the way through from an upper principal surface to a lower principal surface thereof;

a lid body formed in a cylindrical shape and made of a metal, the lid body including an upper end face having a through hole formed therein and a lower end which is left opened and joined to an outer periphery of the upper principal surface of the base body;

a light-transmitting member bonded around an opening of the through hole of the lid body; and an input/output terminal joined to the upper principal surface of the base body so as to cover the through bore, the input/output terminal including:

a first plate portion formed of a dielectric substance, which is disposed uprightly on the upper principal surface of the base body so as to lie across the through bore;

a line conductor formed on one principal surface of the first plate portion so as to extend from one base body-side edge to another edge opposite thereto of the one principal surface;

a second plate portion formed of a dielectric substance, which is stacked on the one principal surface of the first plate portion, with its one base body-side end face made flush with the first plate portion;

a metal plate formed so as to be made higher than the first plate portion, which is stacked on another principal surface of the first plate portion, with its one base body-side end face made flush with the first plate portion; and a lead terminal attached to a part of a lower surface of the input/output terminal which lies inside the through bore, the lead terminal being electrically connected to the line conductor.

2. A package for housing an optical semiconductor element comprising:

a base body made of a platy metal having a through bore drilled all the way through from an upper principal surface to a lower principal surface thereof;

a lid body formed in a cylindrical shape and made of a metal, the lid body including an upper end face having a through hole formed therein and a lower end which is left opened and joined to an outer periphery of the upper principal surface of the base body;

a light-transmitting member bonded around an opening of the through hole of the lid body; and an input/output terminal joined to the upper principal surface of the base body so as to cover the through bore, the input/output terminal including:

a first plate portion formed of a dielectric substance, which is disposed uprightly on the upper principal surface of the base body so as to lie across the through bore;

a line conductor formed on one principal surface of the first plate portion so as to extend from one base body-side edge to another edge opposite thereto of the one principal surface;

a second plate portion formed of a dielectric substance, which is stacked on the one principal surface of the first plate portion, with its one base body-side end face made flush with the first plate portion;

a metal plate formed so as to be made higher than the first plate portion, which is stacked on another principal surface of the first plate portion, with its one base body-side end face inserted into the through bore so as to jut out below the first plate portion and the lower principal surface of the base body; and a lead terminal attached to a part of a lower surface of the input/output terminal which lies inside the through bore, the lead terminal being electrically connected to the line conductor.

3. The package of claim 1, wherein, in the input/output terminal, a notch is formed in a part of one base body-side end face of the second plate portion which is contiguous to the line conductor so that one end of the line conductor is exposed, and the lead terminal is electrically connected to the one end of the line conductor.

4. The package of claim 2, wherein, in the input/output terminal, a notch is formed in a part of one base body-side end face of the second plate portion which is contiguous to the line conductor so that one end of the line conductor is exposed, and the lead terminal is electrically connected to the one end of the line conductor.

5. The package of claim 1, another other end face of the metal plate opposite to one base body-side end face thereof is shaped into a slant surface.

6. The package of claim 2, another other end face of the metal plate opposite to one base body-side end face thereof is shaped into a slant surface.

7. An optical semiconductor apparatus comprising:

the package of claim 1; and an optical semiconductor element attached to the exposed top end of the first plate portion-side surface of the metal plate so as to be electrically connected to the line conductor, wherein a lower end of the lid body is joined to the outer periphery of the upper principal surface of the base body in a state where the light-transmitting member attached thereto faces a light-receiving or light-emitting portion of the optical semiconductor element.

8. An optical semiconductor apparatus comprising:

the package of claim 2; and an optical semiconductor element attached to the exposed top end of the first plate portion-side surface of the metal plate so as to be electrically connected to the line conductor, wherein a lower end of the lid body is joined to the outer periphery of the upper principal surface of the base body in a state where the light-transmitting member attached thereto faces a light-receiving or light-emitting portion of the optical semiconductor element.

* * * * *